United States Patent
Yu

(10) Patent No.: US 11,452,233 B2
(45) Date of Patent: Sep. 20, 2022

(54) METHOD AND APPARATUS FOR CONTROLLING FAN SPEED

(71) Applicant: ZHENGZHOU YUNHAI INFORMATION TECHNOLOGY CO., LTD., Henan (CN)

(72) Inventor: Guangyi Yu, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 485 days.

(21) Appl. No.: 16/493,296

(22) PCT Filed: Mar. 8, 2019

(86) PCT No.: PCT/CN2019/077394
§ 371 (c)(1),
(2) Date: Sep. 11, 2019

(87) PCT Pub. No.: WO2020/034627
PCT Pub. Date: Feb. 20, 2020

(65) Prior Publication Data
US 2021/0337702 A1 Oct. 28, 2021

(30) Foreign Application Priority Data
Aug. 13, 2018 (CN) .......................... 201810917218.1

(51) Int. Cl.
*H05K 7/20* (2006.01)
*F04D 27/00* (2006.01)

(52) U.S. Cl.
CPC ..... *H05K 7/20209* (2013.01); *H05K 7/20136* (2013.01); *H05K 7/20836* (2013.01); *F04D 27/004* (2013.01)

(58) Field of Classification Search
CPC ................ F04D 27/001; F04D 27/004; F05D 2270/303; H05K 7/20136; H05K 7/20209; H05K 7/20727; H05K 7/20836
See application file for complete search history.

(56) References Cited

U.S. PATENT DOCUMENTS 7,138,781 B2 * 11/2006 Murray ................ G05B 13/024
318/609
2009/0228148 A1 * 9/2009 Byquist .................. G06F 1/206
700/275

(Continued)

FOREIGN PATENT DOCUMENTS

CN 104391555 A 3/2015
CN 105587681 A * 5/2016

(Continued)

OTHER PUBLICATIONS

International Search Report for PCT/CN2019/077394 dated May 15, 2019, ISA/CN.

(Continued)

*Primary Examiner* — Kidest Bahta
(74) *Attorney, Agent, or Firm* — Yue (Robert) Xu; Apex Attorneys at Law, LLP

(57) ABSTRACT

A method and apparatus for controlling fan speed are provided. The method obtains a first PWM value and a second PWM value of the fan based on the temperature of the server component respectively through a PID regulation algorithm and an open-loop control algorithm, and controls the fan speed based on the larger value of the first PWM value and the second PWM value.

14 Claims, 3 Drawing Sheets

(56) References Cited

U.S. PATENT DOCUMENTS

| | | |
|---|---|---|
| 2011/0273120 A1 | 11/2011 | Takeuchi |
| 2012/0078420 A1* | 3/2012 | Jensen .................... G06F 1/206 |
| | | 700/275 |
| 2013/0084192 A1 | 4/2013 | Lee |
| 2017/0187310 A1 | 6/2017 | Hung |

FOREIGN PATENT DOCUMENTS

| | | | |
|---|---|---|---|
| CN | 205446130 U | | 8/2016 |
| CN | 106321482 A | | 1/2017 |
| CN | 106907343 A | | 6/2017 |
| CN | 107165849 A | * | 9/2017 |
| CN | 107762936 A | | 3/2018 |
| CN | 108255272 A | | 7/2018 |
| CN | 108279754 A | | 7/2018 |
| CN | 108628425 A | | 10/2018 |
| CN | 109026807 A | | 12/2018 |
| JP | 2006177163 A | | 7/2006 |

OTHER PUBLICATIONS

CNIPA First Office Action corresponding to Application No. 201810917218.1; dated Jun. 27, 2019.

\* cited by examiner

METHOD AND APPARATUS FOR CONTROLLING FAN SPEED

CROSS REFERENCE OF RELATED APPLICATION

This application is the national phase of International application No. PCT/CN2019/077394, which claims the priority to Chinese Patent Application No. 201810917218.1, titled "METHOD AND APPARATUS FOR CONTROLLING FAN SPEED", filed on Aug. 13, 2018 with the China National Intellectual Property Administration, both of which are incorporated herein by reference in their entirety.

FIELD

The preset disclosure relates to the field of computer technology, and particularly to a method and an apparatus for controlling fan speed.

BACKGROUND

At present, in a speed control solution of a server fan, a temperature of a single component is controlled by only one single control method, for example, by piecewise regulation, linear regulation, or PID (Proportion Integration Differentiation, proportion integration differentiation) regulation.

The piecewise regulation and the linear regulation adopt open-loop control. The fan speed directly corresponds to a temperature value of a component and cannot be adjusted for a feedback of an abnormal temperature change. For example, a maximum PWM value of the fan, which is corresponding to the temperature of the component, is set to 50%. Even if an abnormal condition causes overtemperature to the component, the fan speed will not increase to a higher speed, thereby resulting in a risk of excessive temperature of the component under severe operating conditions.

The PID regulation adopts a closed-loop control mechanism. When the temperature of the component rises, the fan speed can be continuously increased. For example, if the temperature of the component is always higher than a reference value, the fan speed can be increased to full speed. For both a good heat dissipation condition and a bad heat dissipation condition, the PID regulation can realize different fan speeds to control the temperature of the component near the reference value. The PID regulation can address the problems of the open-loop control. However, PID regulation has the following disadvantages:

Due to a rapid change of the temperature of the server component, the fan speed cannot be stabilized at a fixed value, and is susceptible to speed fluctuations. This is because a PID algorithm is related to a temperature difference and a temperature change speed, and a parameter needs to be adjusted to stabilize the fan speed under different pressures. The adjustment process takes a very long time, and a final parameter cannot guarantee stability of the fan speed under all circumstances.

SUMMARY

A method for controlling fan speed includes:
obtaining a temperature of a server component;
obtaining, by a PID regulation algorithm, a first PWM value of a fan corresponding to the temperature of the server component based on the temperature of the server component;
obtaining, by an open-loop control algorithm, a second PWM value of the fan corresponding to the temperature of the server component based on the temperature of the server component;
comparing the first PWM value with the second PWM value; and
controlling the fan speed by a larger value of the first PWM value and the second PWM value.

An apparatus for controlling fan speed includes:
an obtaining unit configured to obtain a temperature of a server component;
a first PWM value obtaining unit configured to obtain, by a PID regulation algorithm, a first PWM value of a fan corresponding to the temperature of the server component based on the temperature of the server component;
a second PWM value obtaining unit configured to obtain, by an open-loop control algorithm, a second PWM value of the fan corresponding to the temperature of the server component based on the temperature of the server component;
a comparison unit configured to compare the first PWM value with the second PWM value; and
a control unit configured to control the fan speed by a larger value of the first PWM value and the second PWM value.

BRIEF DESCRIPTION OF THE DRAWINGS

For explaining technical solutions according to embodiments of the disclosure or the conventional technology more clearly, drawings used in the illustration of the embodiments or the conventional technology are described briefly. Apparently, the drawings in the following description are merely some of the embodiments of the disclosure, and other drawings may be obtained based on the drawings by those skilled in the art without any creative effort.

DETAILED DESCRIPTION

In order to solve the technical problems described in background, a method for controlling fan speed is provided according to embodiments of the present disclosure. The method includes: obtaining a temperature of a server component; obtaining, by a PID regulation algorithm, a first PWM value of a fan corresponding to the temperature of the server component based on the temperature of the server component; obtaining, by an open-loop control algorithm, a second PWM value of the fan corresponding to the temperature of the server component based on the temperature of the server component; comparing the first PWM value with the second PWM value; and controlling the fan speed by a larger value of the first PWM value and the second PWM value.

The method for controlling fan speed obtains the first PWM value of the fan through the PID regulation algorithm based on the temperature of the server component and the second PWM value of the fan through the open-loop control algorithm based on the temperature of the server component; and controls the fan speed based on the larger value of the first PWM value and the second PWM value. Therefore, the method avoids the problem that the open-loop control cannot adjust the fan speed based on a feedback of an abnormal temperature change, by comprehensively controlling the fan speed through the PID regulation and the open-loop control. The method also addresses the problem of speed fluctuation caused by the PID regulation, so that the fan speed can be quickly stabilized. Moreover, the method simplifies setting of a parameter of the PID regulation, thereby reducing an adjustment time of the parameter, and preventing the fan speed from notably fluctuating.

In order to enable those skilled in the art to better understand the solution of the present disclosure, the technical solution according to the embodiments of the present disclosure will be described clearly and completely as follows in conjunction with the drawings. It is apparent that the described embodiments are only a few rather than all of the embodiments according to the present disclosure. Any other embodiments obtained by those skilled in the art based on the embodiments in the present disclosure without any creative work fall in the scope of the present disclosure.

First Embodiment

Figure 1:
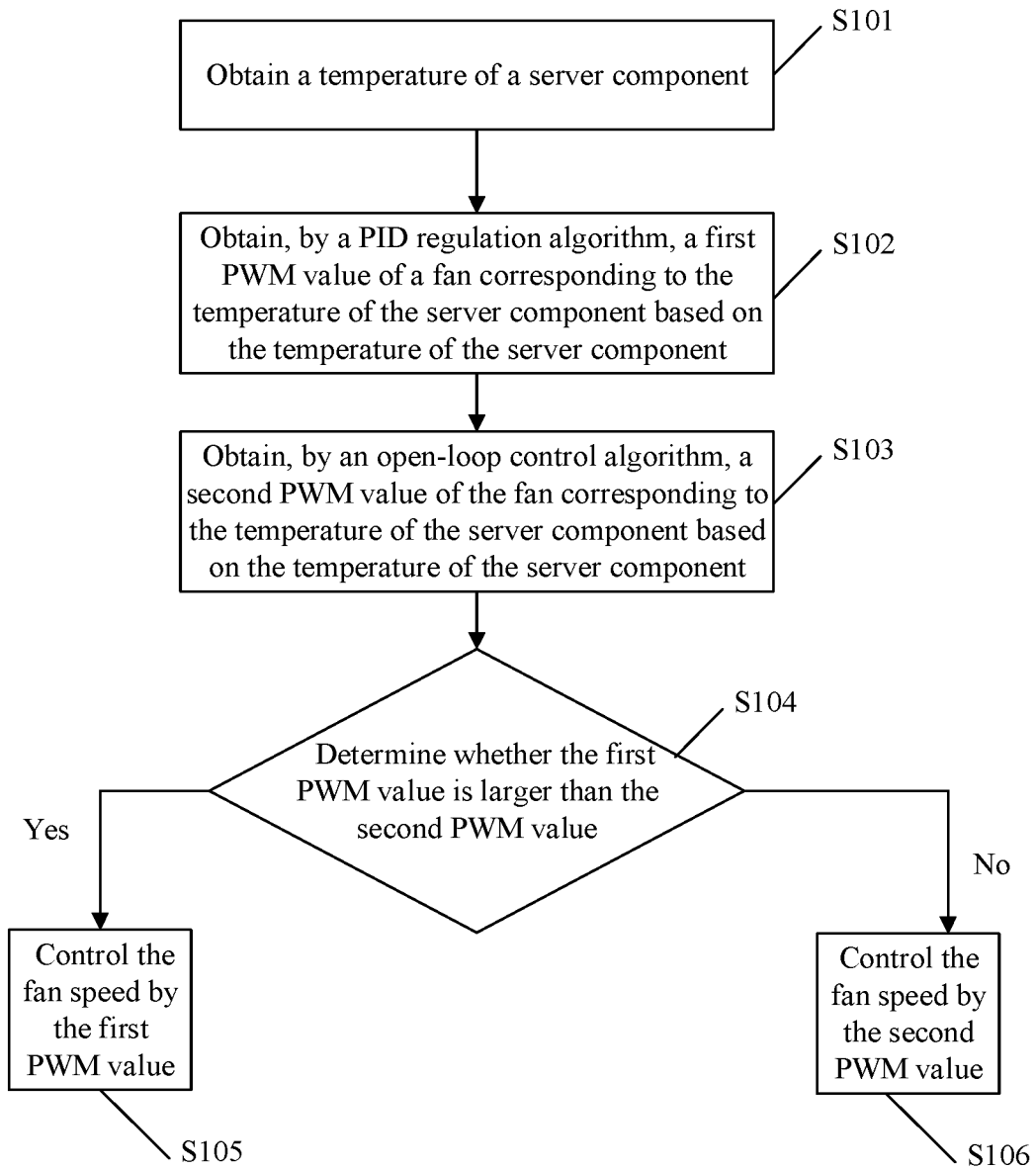
FIG. 1 is a flowchart of a method for controlling fan speed according to a first embodiment of the present disclosure.

Reference is made to FIG. 1 which is a flowchart of a method for controlling fan speed according to a first embodiment of the present disclosure.

The method for controlling fan speed according to the present disclosure includes steps S101 to S106.

In step S101, a temperature of a server component is obtained.

In step S102, a first PWM value of a fan corresponding to the temperature of the server component is obtained based on the temperature of the server component, by a PID regulation algorithm.

The PID regulation algorithm can obtain a corresponding PWM value based on a current temperature.

To further avoid the problem that the open-loop control cannot adjust the fan speed based on a feedback of an abnormal temperature change, step S102 may include steps S102a, S102b, and S102c.

In step S102a, a temperature difference between the temperature of the server component and a reference temperature is calculated.

The reference temperature is a set temperature in the PID regulation algorithm, and can be set in advance.

The temperature difference=the temperature of the server component−the reference temperature.

In step S102b, a change amount of PWM value of the fan is calculated based on the temperature of the server component and the temperature difference.

The temperature difference is an input value of the PID regulation algorithm, and the change amount of PWM value is an output value of the PID regulation algorithm.

A computational formula of the PID regulation algorithm is as follow:

$$u(t) = MV(t) = K_p e(t) + K_i \int_0^t e(\tau)d\tau + K_d \frac{de}{dt}(t)$$

In the formula, t represents a time variable;
e(t) represents the temperature difference;
u(t) represents the change amount of PWM value;
Kp represents a proportional coefficient;
Ki represents an integral coefficient; and
Kd represents a differential coefficient.

In step S102c, the change amount of PWM value is added to a current PWM value of the fan to obtain the first PWM value.

The first PWM value=the change amount of PWM value+ the current PWM value.

In step S103, a second PWM value of the fan corresponding to the temperature of the server component is obtained based on the temperature of the server component, by an open-loop control algorithm.

The open-loop control algorithm may be a piecewise regulation algorithm, or a linear regulation algorithm.

As a sample, description is made with the open-loop control algorithm being the linear regulation algorithm hereinafter.

To further address the problem of speed fluctuation caused by the PID regulation and reduce a time to stabilize the fan speed, step S103 may include: taking the temperature of the server component as an input value of the linear regulation algorithm, and taking the second PWM value as an output value of the linear regulation algorithm.

A computational formula of the linear regulation algorithm may be:

$$PWM2 = K_a T + K_b$$

In the formula, T represents the temperature of the component;
PWM2 represents the calculated second PWM value;
Ka and Kb represent corresponding linear control coefficients.

In step S104, whether the first PWM value is larger than the second PWM value is determined by comparison; and if yes, step S105 is performed, if not, step S106 is performed.

In step S105, the fan speed is controlled by the first PWM value.

In step S106, the fan speed is controlled by the second PWM value.

The method for controlling fan speed according to the present disclosure obtains the first PWM value of the fan through the PID regulation algorithm based on the temperature of the server component and the second PWM value of the fan through the open-loop control algorithm based on the temperature of the server component; and controls the fan speed based on the larger value of the first PWM value and the second PWM value. Therefore, the method avoids the problem that the open-loop control cannot adjust the fan speed based on a feedback of an abnormal temperature change, by comprehensively controlling the fan speed through the PID regulation and the open-loop control. The method also addresses the problem of speed fluctuation caused by the PID regulation, so that the fan speed can be quickly stabilized. Moreover, the method simples a setting of a parameter of the PID regulation, thereby reducing an adjustment time of the parameter, and preventing the fan speed from notably fluctuating.

To further avoid the problem that the open-loop control cannot adjust the fan speed based on the feedback of the abnormal temperature change, and address the problem of the speed fluctuation caused by the PID regulation, another method for controlling fan speed is further provided according to the embodiments of the present disclosure, which is introduced in conjunction with the figures.

Second Embodiment

The second embodiment is improved from the first embodiment. Therefore, part of the content of the second embodiment is similar to that of the first embodiment, which is not repeated herein for the sake of brevity.

After controlling the fan speed based on the larger value of the first PWM value and the second PWM value, the method according to the second embodiment further includes: replacing a currently stored PWM value with the larger value of the first PWM value and the second PWM value.

Figure 2:
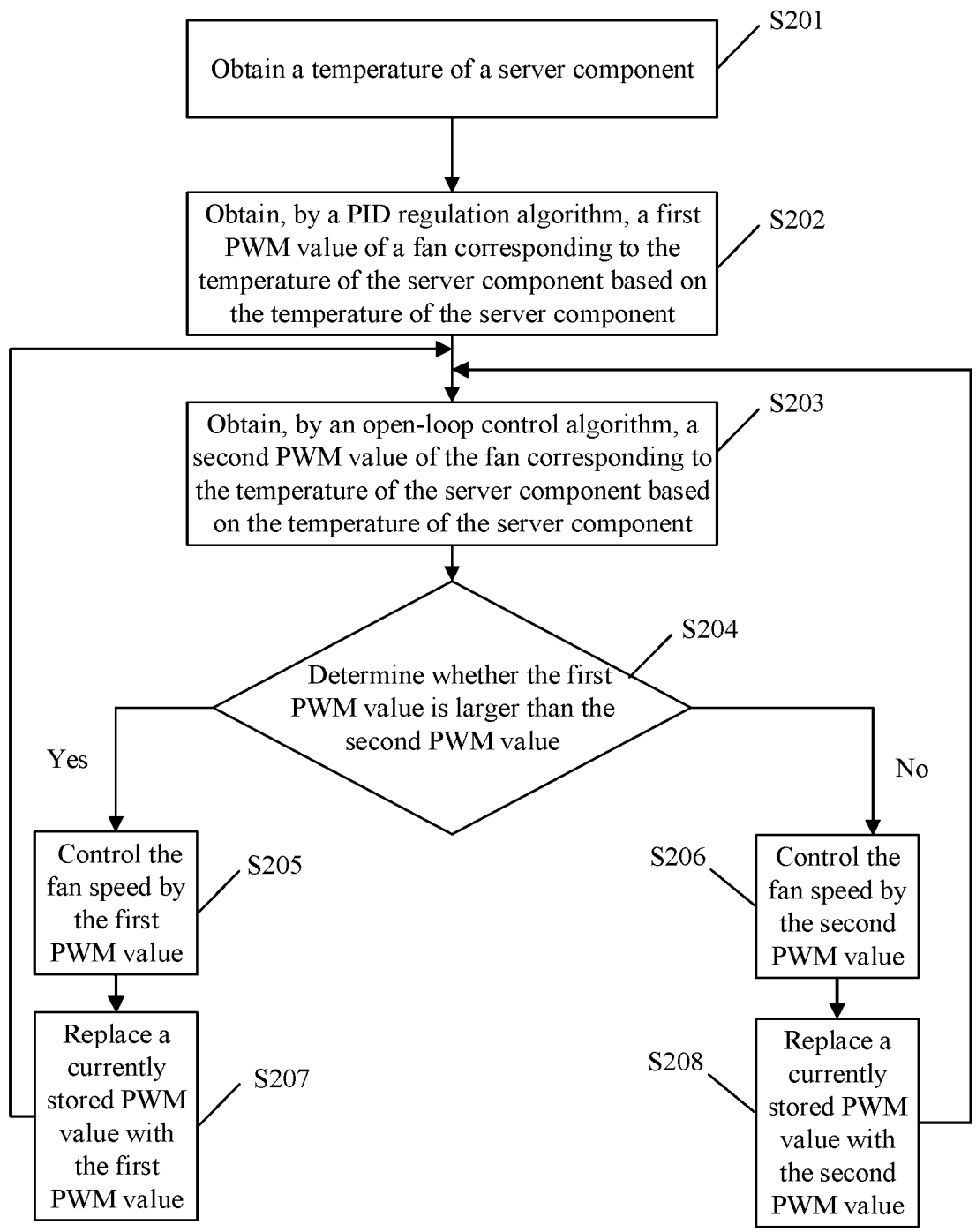
FIG. 2 is a flowchart of a method for controlling fan speed according to a second embodiment of the present disclosure.

Reference is made to FIG. 2, which is a flowchart of a method for controlling fan speed according to the second embodiment of the present disclosure.

The method for controlling fan speed according to the embodiment of the present disclosure may include step S201 to S208.

Steps S201 to S206 are the same with steps S101 to S106, which are not repeated herein.

In step S207, a currently stored PWM value is replaced with the first PWM value.

After step S205, in order to obtain the PWM for controlling the fan speed later, the currently stored PWM value needs to be replaced with the first PWM value.

In step S208, the currently stored PWM value is replaced with the second PWM value.

After step S206, in order to obtain the PWM for controlling the fan speed later, the currently stored PWM value needs to be replaced with the second PWM value.

After controlling the fan speed based on the larger value of the first PWM value and the second PWM value, the method according to the second embodiment further includes: replacing the currently stored PWM value with the larger value of the first PWM value and the second PWM value, to obtain the PWM for controlling the fan speed later, thereby further avoiding the problem that the open-loop control cannot adjust the fan speed based on the feedback of the abnormal temperature change, and addressing the problem of the speed fluctuation caused by the PID regulation.

An apparatus for controlling fan speed is further provided according to the embodiments of the present disclosure, which is described in conjunction with the figures hereinafter.

Third Embodiment

Figure 3:
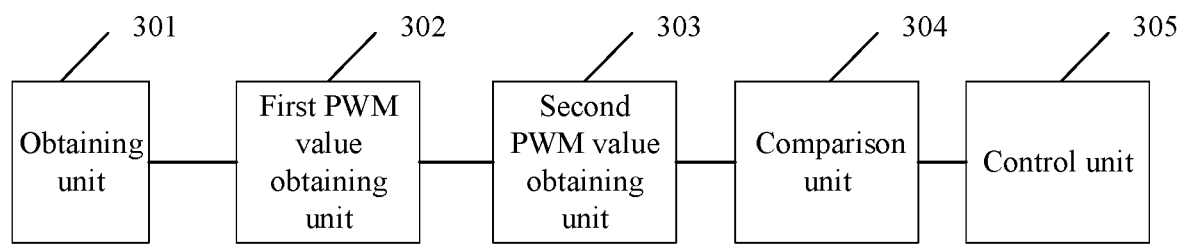
FIG. 3 is a structural schematic diagram of an apparatus for controlling fan speed according to a third embodiment of the present disclosure.

Reference is made to FIG. 3, which is a structural schematic diagram of an apparatus for controlling fan speed according to a third embodiment of the present disclosure.

The apparatus for controlling fan speed according to the third embodiment of the present disclosure includes: an obtaining unit 301, a first PWM value obtaining unit 302, a second PWM value obtaining unit 303, a comparison unit 304, and a control unit 305.

The obtaining unit 301 is configured to obtain a temperature of a server component.

The first PWM value obtaining unit 302 is configured to obtain, by a PID regulation algorithm, a first PWM value of a fan corresponding to the temperature of the server component based on the temperature of the server component.

The second PWM value obtaining unit 303 is configured to obtain, by an open-loop control algorithm, a second PWM value of the fan corresponding to the temperature of the server component based on the temperature of the server component.

The comparison unit 304 is configured to compare the first PWM value with the second PWM value.

The control unit 305 is configured to control the fan speed by a larger value of the first PWM value and the second PWM value.

To further avoid the problem that the open-loop control cannot adjust the fan speed based on the feedback of the abnormal temperature change, and address the problem of the speed fluctuation caused by the PID regulation, the first PWM value obtaining unit 302 may include a first calculation subunit, a second calculation subunit, and a processing subunit.

The first calculation subunit is configured to calculate a temperature difference between the temperature of the server component and a reference temperature.

The second calculation subunit is configured to calculate a change amount of PWM value of the fan based on the temperature of the server component and the temperature difference.

The processing subunit is configured to add the change amount of PWM value to a current PWM value of the fan to obtain the first PWM value.

To further avoid the problem that the open-loop control cannot adjust the fan speed based on the feedback of the abnormal temperature change, and address the problem of the speed fluctuation caused by the PID regulation, the open-loop control algorithm may be a piecewise regulation algorithm, or a linear regulation algorithm.

To further avoid the problem that the open-loop control cannot adjust the fan speed based on the feedback of the abnormal temperature change, and address the problem of the speed fluctuation caused by the PID regulation, the device further includes a replacing unit.

The replacing unit is configured to replace a currently stored PWM value with the larger value of the first PWM value and the second PWM value.

To further avoid the problem that the open-loop control cannot adjust the fan speed based on the feedback of the abnormal temperature change, and address the problem of the speed fluctuation caused by the PID regulation, the second PWM value is smaller than a PWM value actually required for heat dissipation of the server component.

The apparatus for controlling fan speed obtains the first PWM value of the fan through the PID regulation algorithm based on the temperature of the server component and the second PWM value of the fan through the open-loop control algorithm based on the temperature of the server component; and controls the fan speed based on the larger value of the first PWM value and the second PWM value. Therefore, the apparatus avoids the problem that the open-loop control cannot adjust the fan speed based on a feedback of an abnormal temperature change, by comprehensively controlling the fan speed through the PID regulation and the open-loop control. The apparatus also addresses the problem of speed fluctuation caused by the PID regulation, so that the fan speed can be quickly stabilized. Moreover, the method simplifies setting of a parameter of the PID regulation, thereby reducing an adjustment time of the parameter, and preventing the fan speed from notably fluctuating.

As a sample, the apparatus for controlling fan speed according to the embodiment of the present disclosure may be integrated into a baseboard management controller (BMC, Baseboard Management Controller) of a server.

The above are some implementation of the embodiments of the present application.

The invention claimed is:
1. A method for controlling fan speed, comprising:
obtaining a temperature of a server component;
obtaining, by a proportion integration differentiation (PID) regulation algorithm, a first pulse width modulation (PWM) value of a fan corresponding to the temperature of the server component based on the temperature of the server component;

obtaining, by an open-loop control algorithm, a second PWM value of the fan corresponding to the temperature of the server component based on the temperature of the server component;

comparing the first PWM value with the second PWM value; and controlling the fan speed by a larger value of the first PWM value and the second PWM value.

2. The method according to claim 1, wherein, obtaining, by the PID regulation algorithm, the first PWM value of the fan corresponding to the temperature of the server component based on the temperature of the server component comprises:

calculating a temperature difference between the temperature of the server component and a reference temperature;

calculating a change amount of PWM value of the fan based on the temperature of the server component and the temperature difference; and adding the change amount of PWM value to a current PWM value of the fan to obtain the first PWM value.

3. The method according to claim 1, wherein, the open-loop control algorithm comprises a piecewise regulation algorithm or a linear regulation algorithm.

4. The method according to claim 1, further comprising:
replacing a currently stored PWM value with the larger value of the first PWM value and the second PWM value.

5. The method according to claim 1, wherein, the second PWM value is smaller than a PWM value actually required for heat dissipation of the server component.

6. An apparatus for controlling fan speed, comprising a processor and a memory having stored thereon instructions, wherein the instructions, when executed by the processor, cause the processor to:

obtain a temperature of a server component;

obtain, by a proportion integration differentiation (PID) regulation algorithm, a first pulse width modulation (PWM) value of a fan corresponding to the temperature of the server component based on the temperature of the server component;

obtain, by an open-loop control algorithm, a second PWM value of the fan corresponding to the temperature of the server component based on the temperature of the server component;

compare the first PWM value with the second PWM value; and control the fan speed by a larger value of the first PWM value and the second PWM value.

7. The apparatus according to claim 6, wherein, the instructions cause the processor to:

calculate a temperature difference between the temperature of the server component and a reference temperature;

calculate a change amount of PWM value of the fan based on the temperature of the server component and the temperature difference; and add the change amount of PWM value to a current PWM value of the fan to obtain the first PWM value.

8. The apparatus according to claim 6, wherein, the open-loop control algorithm comprises a piecewise regulation algorithm or a linear regulation algorithm.

9. The apparatus according to claim 6, wherein the instructions further cause the processor to:

replace a currently stored PWM value with the larger value of the first PWM value and the second PWM value.

10. The apparatus according to claim 6, wherein, the second PWM value is smaller than a PWM value actually required for heat dissipation of the server component.

11. The method according to claim 2, wherein, the open-loop control algorithm comprises a piecewise regulation algorithm or a linear regulation algorithm.

12. The method according to claim 2, further comprising:
replacing a currently stored PWM value with the larger value of the first PWM value and the second PWM value.

13. The apparatus according to claim 7, wherein, the open-loop control algorithm comprises a piecewise regulation algorithm or a linear regulation algorithm.

14. The apparatus according to claim 7, wherein the instructions further cause the processor to:

replace a currently stored PWM value with the larger value of the first PWM value and the second PWM value.

* * * * *